US 6,734,373 B2

(12) United States Patent
Seki

(10) Patent No.: US 6,734,373 B2
(45) Date of Patent: May 11, 2004

(54) THROUGH HOLE INSERTION TYPE ELECTRONIC COMPONENT AND METHOD OF PACKAGING SAME

(75) Inventor: Hideki Seki, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/176,521

(22) Filed: Jun. 24, 2002

(65) Prior Publication Data

US 2002/0196613 A1 Dec. 26, 2002

(51) Int. Cl.⁷ .................................................. H05K 1/16
(52) U.S. Cl. ........................ 174/260; 174/262; 174/266; 361/760; 361/761
(58) Field of Search ................................. 174/260, 262, 174/263, 264, 265, 266; 361/760, 761, 762, 763, 764

(56) References Cited

U.S. PATENT DOCUMENTS

| | | | |
|---|---|---|---|
| 4,543,715 A | * 10/1985 | Iadarola et al. ............... 29/852 |
| 5,381,306 A | * 1/1995 | Schumacher et al. ........ 361/792 |
| 5,590,029 A | * 12/1996 | Estes .............................. 361/760 |
| 6,137,064 A | * 10/2000 | Kiani et al. ................... 174/266 |
| 6,181,551 B1 | * 1/2001 | Herman et al. ............... 361/684 |
| 6,388,208 B1 | * 5/2002 | Kiani et al. ................... 174/266 |

FOREIGN PATENT DOCUMENTS

JP 63-119213 A 5/1988

* cited by examiner

Primary Examiner—Kamand Cuneo
Assistant Examiner—I B Patel
(74) Attorney, Agent, or Firm—Sughrue Mion, PLLC

(57) ABSTRACT

When an electrode component is inserted into a through hole from one side and then rotated, parts of a conductive film are cut by a cutting blade. Another electrode component including a chip component whose one terminal is connected to an electrode of this electrode component is inserted into the through hole from the other side. When compression bonding is applied to the both electrode components so as to be joined together, an electrode of the former electrode component and the electrode of the latter electrode component are spread within the through hole with the pressure. The spread electrode of the former electrode component contacts a portion of the conductive film that is electrically connected to a front surface wiring, and the spread electrode of the latter electrode component contacts another portion of the conductive film that is electrically connected to a back surface wiring.

14 Claims, 12 Drawing Sheets

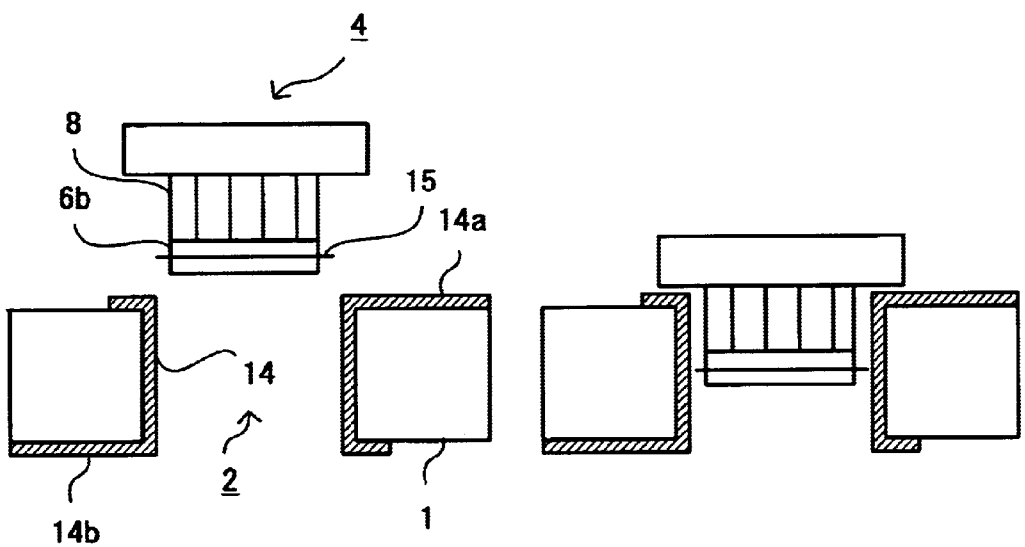
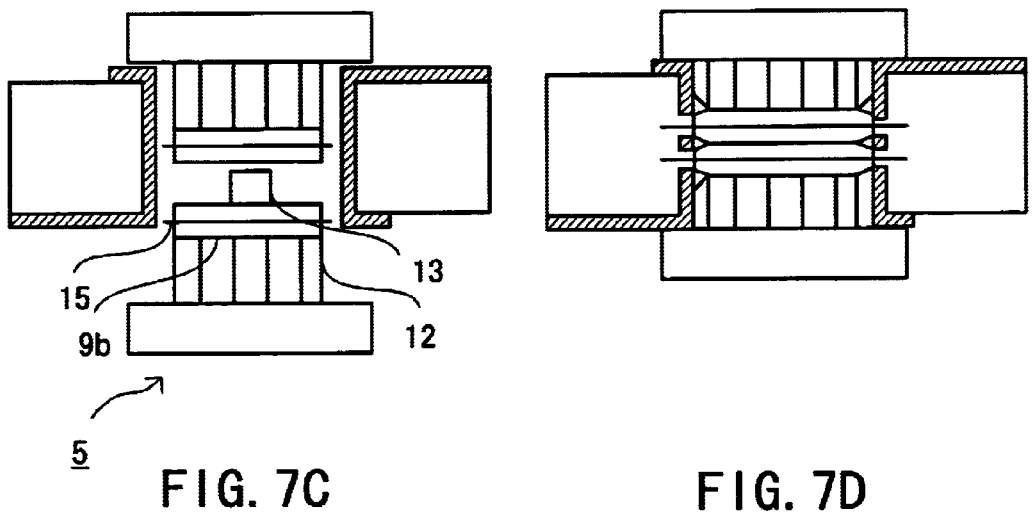
FIG. 7A  FIG. 7B  FIG. 7C  FIG. 7D

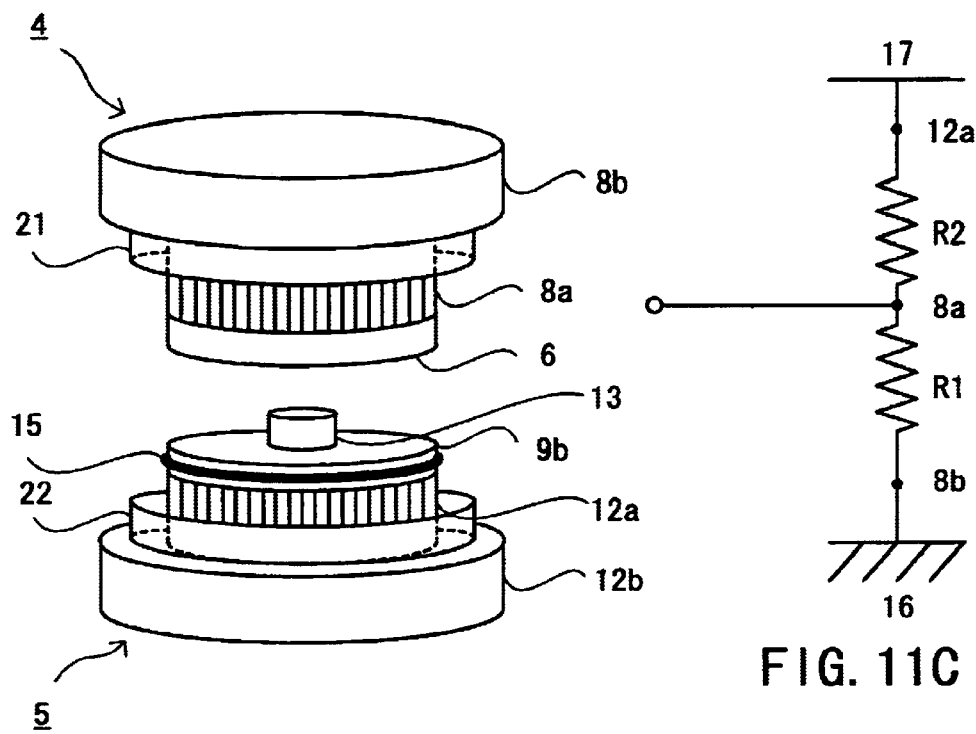
FIG. 11A
FIG. 11C
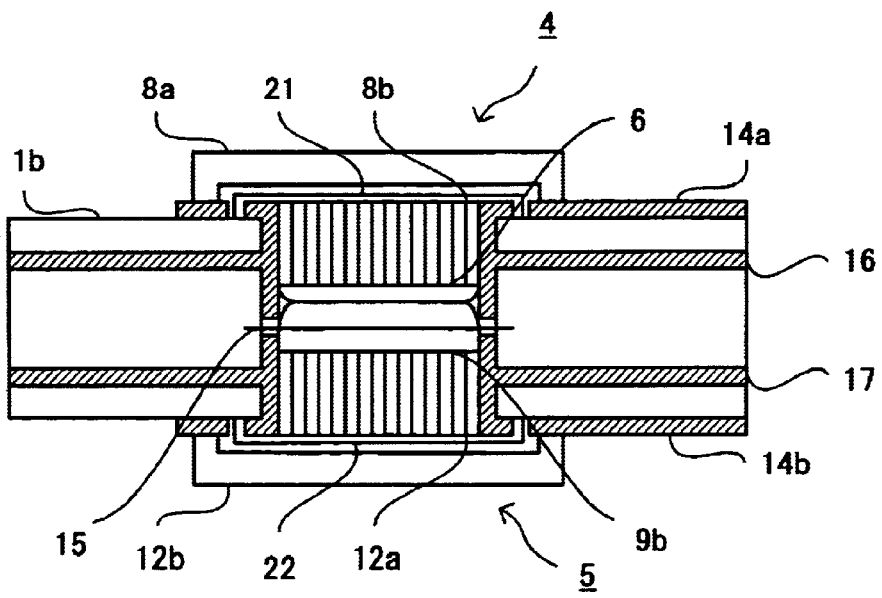
FIG. 11B

THROUGH HOLE INSERTION TYPE ELECTRONIC COMPONENT AND METHOD OF PACKAGING SAME

BACKGROUND OF THE INVENTION

1. Field of the Invention

The present invention relates to a through hole insertion type electronic component which is to be inserted into a through hole of a printed wiring board, and to a method of packaging the same.

2. Description of the Related Art

As one method of high density packaging, a method of inserting a component ink a through hole of a circuit board having printed wirings formed on both surfaces thereof, is disclosed in Unexamined Japanese Patent Application KOKAI Publication No. S63-119213.

The packaging method disclosed in this publication will be explained below with reference to FIGS. 12A to 12C.

As illustrated in a cross section in FIG. 12A, a chip component 54 is placed in a through hole 53 of a wiring board 51. An upper electrode 55 and lower electrode 56 of the chip component 54 are made of an elastic material having conductivity, and respectively have radial connector terminals 58 and 59 as shown in plan views in FIG. 12B and FIG. 12C.

The radial connector terminal 58 of the upper electrode 55 is electrically connected to a conductive pattern 52 formed on one surface of the wiring board 51, by solder dip 57. The radial connector terminal 59 of the lower electrode 56 is electrically connected to the conductive pattern 52 formed on the other surface of the wiring board 51, by the solder dip 57. The chip component 54 is held in the through hole by the elasticity of the upper electrode 55 and the lower electrode 56.

The above conventional packaging technique has the following problems.

(1) The radial connector terminals 58 and 59 of the electrodes of the chip component 54 need to be connected to the conductive pattern 52 of the double side multi-layer wiring board by solder. However, it is difficult to connect the elastic radial connector terminals 58 and 59 to the conductive pattern 52 of the wiring board 51 by solder. Thus, a lot of time and efforts are required in the soldering process.

(2) A chip component having two electrodes can be packaged with ease, However, packaging of a chip component having three electrodes is structurally difficult.

SUMMARY OF THE INVENTION

The present invention has been made in consideration of the problems of the prior art, and an object of the present invention is to provide a through hole insertion type electronic component which is easy to package, and a method of packaging the same.

Another object of the present invention is to provide a through hole insertion type electronic component suitable for high density packaging with the use of an electronic component having three or more electrodes, and a method of packaging the same.

To solve the above described problems, a through hole insertion type electronic component according to a first aspect of the present invention is an electronic component to be inserted into a through hole of a multi-layer wiring board which comprises: the through hole; a through hole conductive film formed on an internal surface of the through hole; and n (n is an integer equal to or greater than 2) number of wiring patterns which are provided on different layers and connected to the through hole conductive film, the electronic component comprising:

n number of electrodes each of which is to be connected to a corresponding one of n number of electrodes of a chip component which is arranged in the through hole, and each of which contacts a corresponding position of the through hole conductive film; and at least one blade which separates the through hole conductive film into n number of portions each of which is connected to a corresponding one of the n number of wiring patterns and to a corresponding one of the n number of electrodes.

The integer n may represent 2.

The electronic component may comprise: a first electrode component to be packaged on one surface of the multi-layer wiring board; and a second electrode component to be packaged on the other surface of the multi-layer wiring board.

The n number of electrodes may include; a first electrode which is provided to the first electrode component, and is electrically connected to a first electrode of the chip component arranged in the through hole and also contacts the through hole conductive film so as to electrically connect the first electrode of the chip component and the through hole conductive film to each other; and a second electrode which is provided to the second electrode component, and is electrically connected to a second electrode of the chip component arranged in the through hole and also contacts the through hole conductive film so as to electrically connect the second electrode of the chip component and the through hole conductive film to each other.

The blade may be provided to at least one of the first and second electrode components, and may separate the through hole conductive film into: a portion which is electrically connected to the first electrode and a first wiring pattern; and a portion which is electrically connected to the second electrode and a second wiring pattern.

The integer n may represent 3.

The electronic component may comprise: a first electrode component to be packaged on one surface of the multi-layer wiring board; and a second electrode component to be packaged on the other surface of the multi-layer wiring board.

The n number of electrodes may include: a first electrode which is provided to the first electrode component, and is electrically connected to a first electrode of the chip component arranged in the through hole and also contacts the through hole conductive film so as to electrically connect the first electrode of the chip component and the through hole conductive film to each other; a second electrode which is provided to the second electrode component, and is electrically connected to a second electrode of the chip component arranged in the through hole and also contacts the through hole conductive film so as to electrically connect the second electrode of the chip component and the through hole conductive film to each other; and a third electrode which is provided to one of the first electrode component and the second electrode component, and is electrically connected to a third electrode of the chip component arranged in the through hole and also contacts the through hole conductive film so as to electrically connect the third electrode of the chip component and the through hole conductive film to each other.

The blade may be provided to at least one of the first and second electrode components, and may separate the through hole conductive film into: a portion which is electrically connected to the first electrode and a first wiring pattern; a portion which is electrically connected to the second electrode and a second wiring pattern; and a portion which is electrically connected to the third electrode and a third wiring pattern.

The integer n may represent 4,

The electronic component may comprise: a first electrode component to be packaged on one surface of the multi-layer wiring board; and a second electrode component to be packaged on the other surface of the multilayer wiring board.

The n number of electrodes may include: a first electrode which is provided to the first electrode component, and is electrically connected to a first electrode of the chip component arranged in the through hole and also contacts the through hole conductive film so as to electrically connect the first electrode of the chip component and the through hole conductive film to each other; a second electrode which is electrically connected to a second electrode of the chip component arranged in the through hole and also contacts the through hole conductive film so as to electrically connect the second electrode of the chip component and the through hole conductive firm to each other; a third electrode which is provided to the second electrode component, and is electrically connected to a third electrode of the chip component arranged in the through hole and also contacts the through hole conductive film so as to electrically connect the third electrode of the chip component and the through hole conductive film to each other; and a fourth electrode which is electrically connected to a fourth electrode of the chip component arranged in the through hole and also contacts the through hole conductive film so as to electrically connect the fourth electrode of the chip component and the through hole conductive film to each other.

The blade may be provided to at least one of the first and second electrode components, and may separate the through hole conductive film into: a portion which is electrically connected to the first electrode and a first wiring pattern; a portion which is electrically connected to the second electrode and a second wiring pattern; a portion which is electrically connected to the third electrode and a third wiring pattern; and a portion which is electrically connected to the fourth electrode and a fourth wiring pattern.

The through hole insertion type electronic component may further comprise a supporting portion which can be inserted into the through hole, and supports the chip component arranged in the through hole, when it is inserted in the through hole.

The integer n may represent 2.

The electronic component may comprise: a first electrode component to be packaged on one surface of the multi-layer wiring board; and a second electrode component to be packaged on the other surface of the multi-layer wiring board.

The supporting portion may include: a first supporting portion which is formed in the first electrode component and supports one end of the chip component; and a second supporting portion which is formed in the second electrode component and supports the other end of the chip component.

The n number of electrodes may include: a first electrode which is provided to the first electrode component, and is electrically connected to a first electrode of the chip component arranged in the through hole and also contacts the through hole conductive film so as to electrically connect the first electrode of the chip component and the through hole conductive film to each other; and a second electrode which is provided to the second electrode component, and is electrically connected to a second electrode of the chip component arranged in the through hole and also contacts the through bole conductive film so as to electrically connect the second electrode of the chip component and the through hole conductive film to each other.

The blade may be provided to at least one of the first and second electrode components, and may separate the through hole conductive film into: a portion which is electrically connected to the first electrode and a first wiring pattern; and a portion which is electrically connected to the second electrode and a second wiring pattern.

The integer n may represent 3.

The electronic component may comprise: a first electrode component to be packaged on one surface of the multi-layer wiring board; and a second electrode component to be packaged on the other surface of the multi-layer wiring board.

The supporting portion may include: a first supporting portion which is formed in the first electrode component and supports one end of the chip component; and a second supporting portion which is formed in the second electrode component and supports the other end of the chip component.

The n number of electrodes may include: a first electrode which is provided to the first electrode component, and is electrically connected to a first electrode of the chip component arranged in the through hole and also contacts the through hole conductive film so as to electrically connect the first electrode of the chip component and the through hole conductive film to each other; a second electrode which is provided to the second electrode component, and is electrically connected to a second electrode or the chip component arranged in the through hole and also contacts the through hole conductive film so as to electrically connect the second electrode of the chip component and the through hole conductive film to each other; and a third electrode which is provided to one of the first electrode component and the second electrode component, and is electrically connected to a third electrode of the chip component arranged in the through hole and also contacts the through hole conductive film so as to electrically connect the third electrode of the chip component and the through hole conductive film to each other.

The blade may be provided to at least one of the first and second electrode components, and may separate the through hole conductive film into: a portion which is electrically connected to the first electrode and a fist wiring pattern; a portion which is electrically connected to the second electrode and a second wiring pattern; and a portion which is electrically connected to the third electrode and a third wiring pattern.

The integer n may represent 4.

The electronic component may comprise: a first electrode component to be packaged on one surface of the multi-layer wiring board; and a second electrode component to be packaged on the other surface of the multi-layer wiring board.

The supporting portion may include: a first supporting portion which is formed in the first electrode component and supports one end of the chip component; and a second supporting portion which is formed in the second electrode component and supports the other end of the chip component.

The n number of electrodes may include: a first electrode which is provided to the first electrode component, and is electrically connected to a first electrode of the chip component arranged in the through hole and also contacts the through hole conductive film so as to electrically connect the first electrode of the chip component and the through hole conductive film to each other; a second electrode which is electrically connected to a second electrode of the chip component arranged in the through hole and also contacts the through hole conductive film so as to electrically connect the second electrode of the chip component and the through hole conductive film to each other; a third electrode which is provided to the second electrode component, and is electrically connected to a third electrode of the chip component arranged in the through hole and also contacts the through hole conductive film so as to electrically connect the third electrode of the chip component and the through hole conductive film to each other; and a fourth electrode which is electrically connected to a fourth electrode of the chip component arranged in the through hole and also contacts the through hole conductive film so as to electrically connect the fourth electrode of the chip component and the through hole conductive film to each other.

The blade may be provided to at least one of the first and second electrode components, and may separate the through hole conductive film into: a portion which is electrically connected to the first electrode and a first wiring pattern: a portion which is electrically connected to the second electrode and a second wiring pattern; a portion which is electrically connected to the third electrode and a third wiring pattern; and a portion which is electrically connected to the fourth electrode and a fourth wiring pattern.

The electronic component may comprise: a first electrode component to be packaged on one surface of the multi-layer wiring board; and a second electrode component to be packaged on the other surface of the multi-layer wiring board.

The first electrode component and the second electrode component may be pressed against each other, when they are inserted into the through hole.

Each of the n number of electrodes may be provided to one of the first electrode component and the second electrode component, and at least one of the n number of electrodes may become spread to contact the through hole conductive film, when a pressure is applied thereto.

The blade may be rotated with a rotation centering on a portion of the through hole insertion type electronic component that is inserted in the through hole, and thereby to cut the through hole conductive film on the internal surface of the through hole.

The blade may be made of an insulation material.

The n number of electrodes each provided to either one of the first electrode component and the second electrode component may be respectively formed of a plurality of metal pieces having plasticity arranged like a circle.

The n number of electrodes each provided to either one of the first electrode component and the second electrode component may be made of a mixed resin which has plasticity and into which conductive particles are mixed.

The through hole insertion type electronic component may further comprise fixers for fixing the chip component to the through hole insertion type electronic component To solve the above described problems, a through hole insertion type electronic component according to a second aspect of the present invention comprises:

electrodes which are to be inserted into a through hole of a multi-layer wiring board thereby to be connected to electrodes of a chip component arranged in the through hole and also to be connected to a conductive film formed on an internal surface of the through hole; and a blade which cuts the conductive film thereby to separate the conductive film into portions which contact the electrodes and a portion other than those portions.

To solve the above described problems, a through hole insertion type electronic component according to a third aspect of the present invention comprises a first and second electrode components, wherein:

the first electrode component has a first electrode which is to be inserted into a through hole of a multi-layer wiring board thereby to be connected to a first electrode of a chip component arranged in the through hole and also to be connected to a conductive film formed on an internal surface of the through hole, and the second electrode component has a second electrode which is to be inserted into the through hole of the multi-layer wiring board from a side counter to a side from which the first electrode component is inserted and thereby to be connected to a second electrode of the chip component arranged in the through hole and also to be connected to the conductive film formed on the internal surface of the through hole; and at least one of the first and second electrode components has a separator which separates the conductive film into at least a portion which is connected to the first electrode and a portion which is connected to the second electrode.

To solve the above described problems, a method of packaging a through hole insertion type electronic component according to a fourth aspect of the present invention comprises:

preparing a multi-layer wiring board which comprises a through hole, a through hole conductive film formed on an internal surface of the through hole, and n (n is an integer equal to or greater than 2) number of wiring patterns which are provided on different layers and connected to the through hole conductive film;

arranging a chip component comprising n number of externally connecting electrodes, in the through hole;

connecting the n number of electrodes of the chip component arranged in the through hole to corresponding positions of the through hole conductive film; and separating the through hole conductive film into n number of portions each of which is connected to a corresponding one of the n number of wiring patterns and to a corresponding one of the n number of electrodes.

The separating comprises separating the through hole conductive film into at least n number of portions by cutting the through hole conductive film with a blade.

BRIEF DESCRIPTION OF THE DRAWINGS

These objects and other objects and advantages of the present invention will become more apparent upon reading of the following detailed description and the accompanying drawings in which:

FIG. 7A to FIG. 7D are explanatory diagrams showing a method of packaging the through hole insertion type electronic component shown in FIG. 6;

FIG. 11A to FIG. 11C are diagrams showing the structure of a through hole insertion type electronic component according to a seventh embodiment of the present invention.

DETAILED DESCRIPTION OF THE PREFERRED EMBODIMENTS

A through hole insertion type electronic component according to the embodiments of the present invention will be explained below with reference to the drawings.

First Embodiment

Figure 1A:
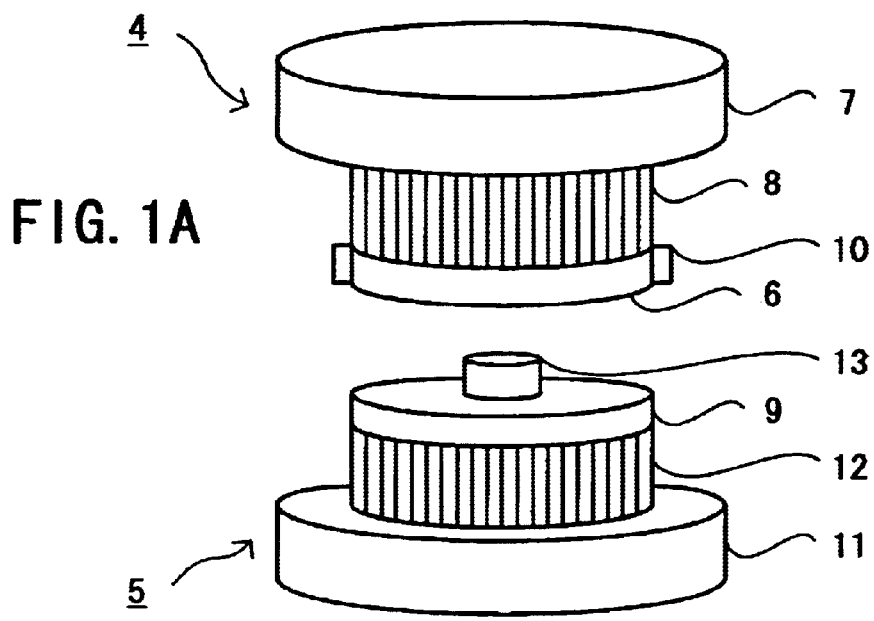
FIG. 1A and FIG. 1B are a perspective diagram and a side view each showing the structure of a through hole insertion type electronic component according to a first embodiment of the present invention.
Figure 1B:
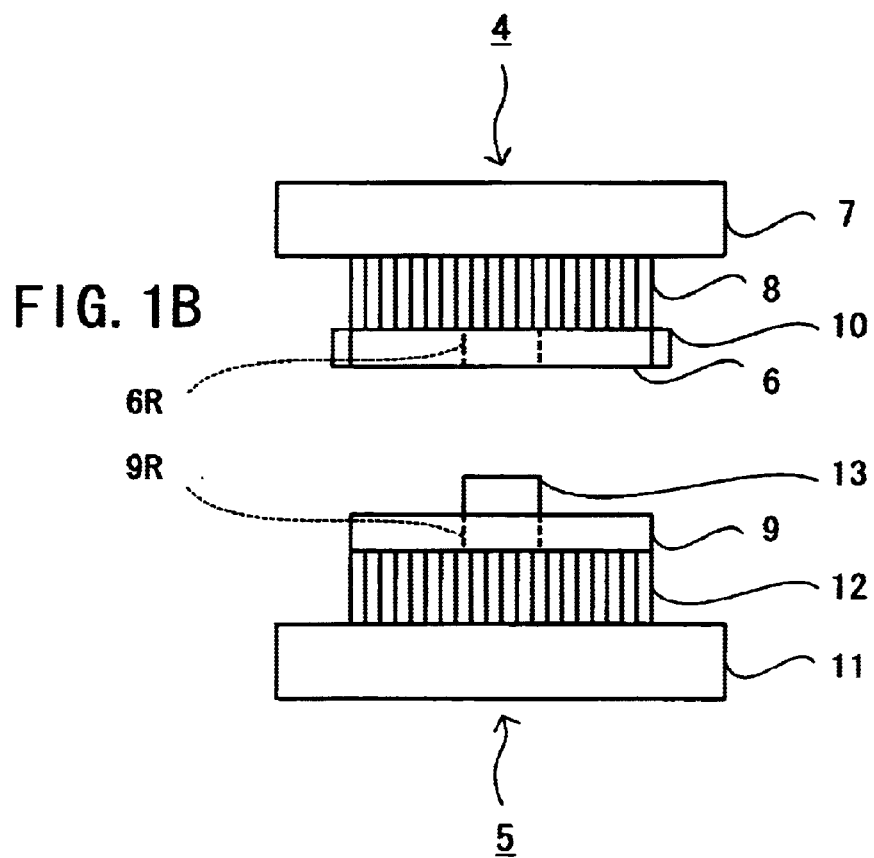

A through hole insertion type electronic component according to a first embodiment comprises an electrode component 4 and an electrode component 5, as shown in the perspective diagram in FIG. 1A, and in the side view in FIG. 1B.

Parts of the respective electrode component 4 and electrode component 5 are inserted with a pressure into a through hole of a multi-layer wiring board so as to be joined together by compression bonding, and thus packaged on the multi-layer wing board.

The electrode component 4 comprises a cylindrical knob 7; a cylindrical electrode 8 provided on the knob 7 with the same axis and having a diameter which can be inserted into a through hole; an insulator 6 formed on the electrode 8 to have the same diameter as that of the electrode 8; and a plurality of cutting blades 10 formed around the side surface of the insulator 6 so as to project therefrom. The electrode component 5 comprises a cylindrical knob 11; an electrode 12 provided on the knob 11 with the same axis and having a diameter which can be inserted into a through hole; and an insulator 9 formed on the electrode 12 to have the same diameter as that of the electrode 12.

The insulator 6 of the electrode component 4 and the insulator 9 of the electrode component 5 contact each other when the electrodes 4 and 5 are mounted on a multi-layer wiring board. The insulator 6 and the insulator 9 respectively have supporting portions 6R and 9R for supporting a chip component 13.

The chip component 13 to be loaded into the supporting portions 6R and 9R of the electrode components 4 and 5 is a component having two electrode, such as a resistor, a capacitor, a fuse, etc.

Each of the electrode 8 and the electrode 12 has a structure which is crushed and thus spread in a through hole, when a pressure is applied thereto. Hereinafter, this structure will be referred to as a "crushable structure".

Figure 2:
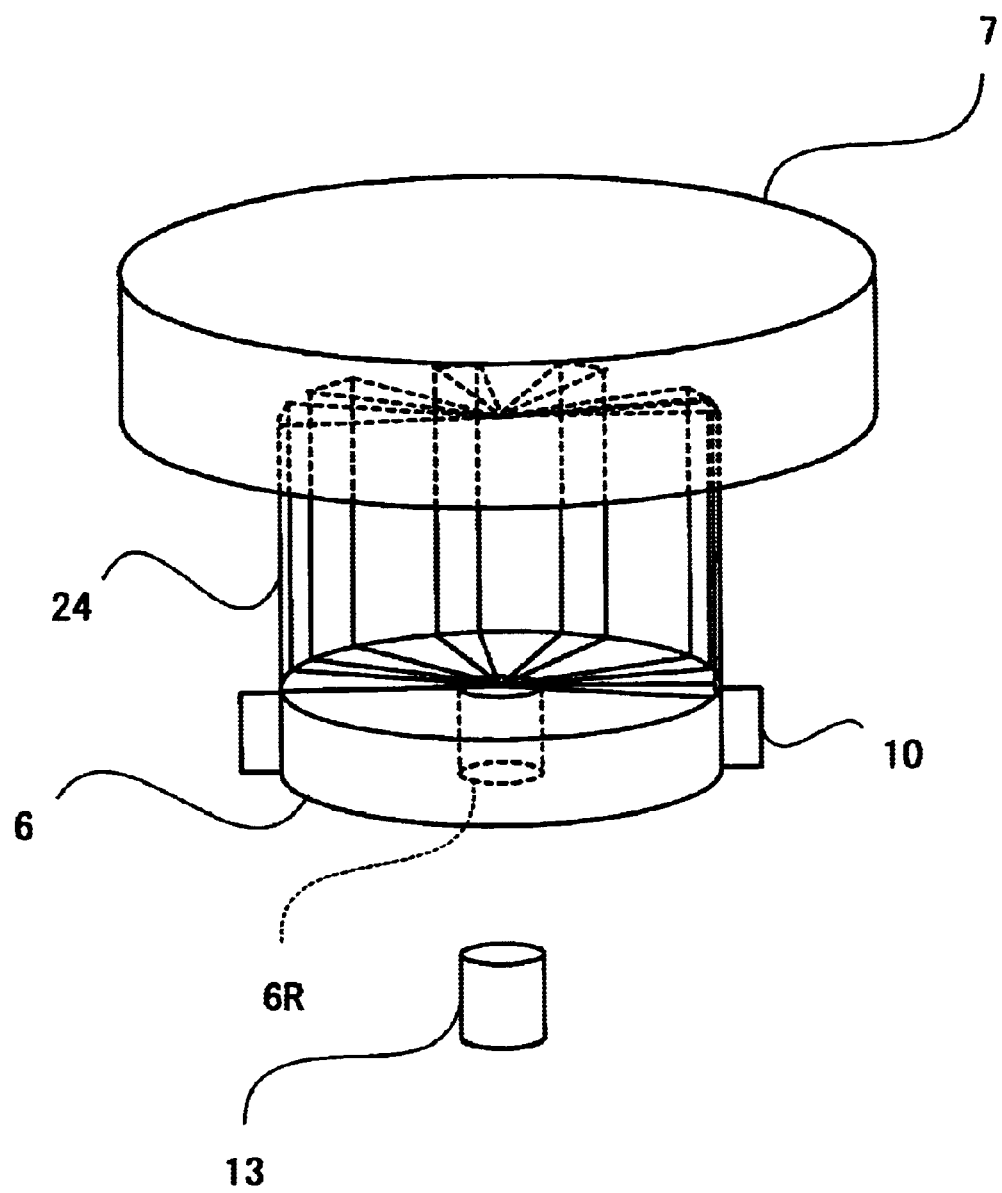
FIG. 2 is a perspective diagram of an electrode component shown in FIG. 1.

Specifically, the electrode 8 is constituted by a plurality of metal pieces 24 arranged along a circumference of a circle, as shown in FIG. 2. When a pressure is applied to the electrode 8 from the upper and lower sides, it is crushed and spread toward beyond the circumference of the circle (toward a direction perpendicular to the core). With this spread, the electrode 8 contacts conductive film on the internal surface of the through hole. The tips of the metal pieces 24 extend into the supporting portion 6R of the insulator 6, so that an electrode on one end of the chip component 13 can contact the metal pieces 24 when the chip component 13 is inserted into the supporting portion 6R of the insulator 6.

The electrode 12 has the same structure as that of the electrode 8.

The cutting blades 10 of the electrode component 4 are provided on the side surface of the insulator 6, and have a size enough to reach the internal surface of a through hole of a multi-layer wiring board, when the electrode component 4 is inserted into this through hole.

Next, a method and steps of packaging the through hole insertion type electronic component of this embodiment into a through hole will be explained with reference to FIG. 3A to FIG. 3G.

Figure 3A:
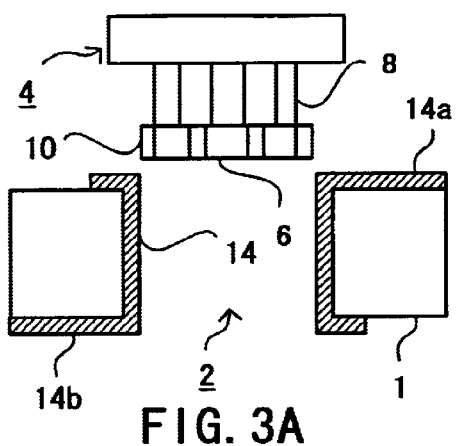
FIG. 3A to FIG. 3G are explanatory diagrams showing a method of packaging the through hole insertion type electronic component shown in FIG. 1, step by step.

As shown in FIG. 3A, a multi-layer wiring board 1, on which the through hole insertion type electronic component will be packaged, comprises a front surface conductive pattern 14a and a back surface conductive pattern 14b. The internal wall of a through hole 2 is copper-plated to form a conductive film 14. The front surface conductive pattern 14a and the back surface conductive pattern 14b are electrically connected to each other when electricity transmits through the conductive film 14 on the through hole 2.

Figure 3B:
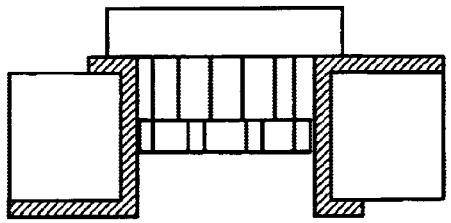
Figure 3C:
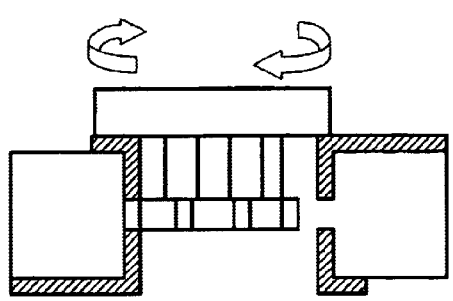
Figure 3D:
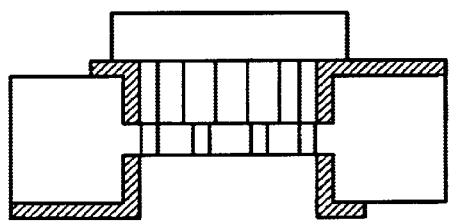

As shown in FIG. 3B and FIG. 3C, the electrode component 4 is inserted into the through hole 2 of the multi-layer wiring board 1, and then rotated by using the knob 7. As shown in FIG. 3C and FIG. 3D, the conductive film 14 is partially cut out by the cutting blades 10. Thus, the front surface conductive pattern 14a and the back surface conductive pattern 14b are electrically disconnected from each other.

Figure 3E:
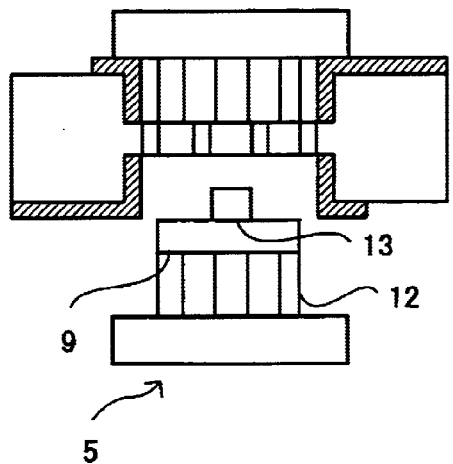
Figure 3F:
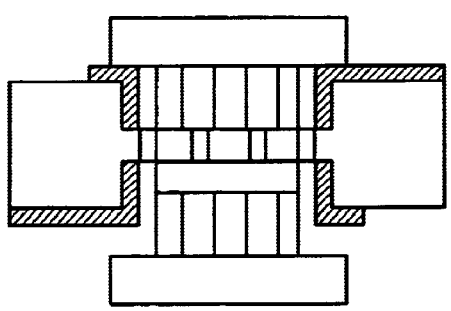

Then, as shown in FIG. 3E and FIG. 3F, the electrode component 5 is inserted into the through hole 2 from the side counter to the side from which the electrode component 4 is inserted, and thus, the electrodes 4 and 5 contact each other by compression bonding. With the electrodes 4 and 5 kept in touch with each other, one end of the chip component 13 is connected to the electrode 8, and the other end thereof is connected to the electrode 12.

Figure 3G:
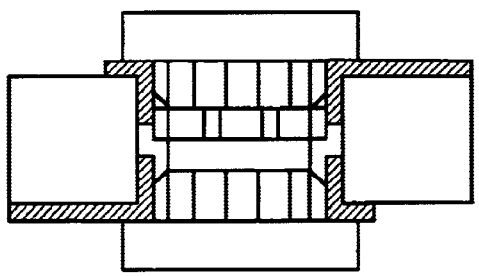

As shown in FIG. 3G, the electrodes 8 and 12 having the "crushable structure" are crushed with the pressure, and spread within the through hole 2. Thus, the electrodes 8 and 12 closely contact the conductive film 14 on the internal wall of the through hole 2. That is, the electrode 8 contacts parts of the conductive film 14 that are electrically connected to the front surface conductive pattern 14a, while the electrode 12 contacts other parts of the conductive film 14 that are electrically connected to the back surface conductive pattern 14b.

Thus, the electrode 8 is connected to the front surface conductive pattern 14a, and the electrode 12 is connected to the back surface conductive pattern 14b. This causes the chip component 13 to be electrically connected both to the front surface conductive pattern 14a and the back surface conductive pattern 14b.

The through hole insertion type electronic component packaged on the wiring board in the way described above has the following advantages.

(1) The electrode 8 and the electrode 12 have a structure that is crushed and spread (crushable structure). Due to this structure, the electrode 8 and the electrode 12 can closely contact the conductive film 14 on the through hole 2. That is, the electrode 8 and the electrode 12 can be electrically connected to the conductive film 14 of the through hole 2 without the need of soldering.

(2) Parts of the conductive film 14 of the through hole 2 can be cut away by the plurality of cutting blades 10. Therefore, the electrical connection between the electrode 8 and the front surface conducive pattern 14a and the electrical connection between the electrode 12 and the back surface conductive pattern 14b can be independently obtained. This implies that there is no short circuit caused between the electrode 8 and the electrode 12.

Second Embodiment

The through hole insertion type electronic component explained in the first embodiment may be packaged on a multi-layer wiring board having an intra-layer conductive pattern.

A method and steps of packaging the through hole insertion type electronic component according to this embodiment into a through hole will be explained below with reference to FIG. 4A to FIG. 4D.

Elements identical to those illustrated in FIG. 1 will be denoted by the same reference numerals.

Figure 4A:
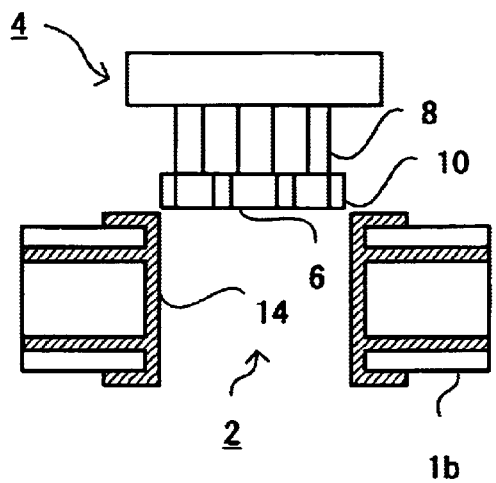
FIG. 4A to FIG. 4D are explanatory diagrams showing a method of packaging a through hole insertion type electronic component according to a second embodiment of the present Invention.

As shown in FIG. 4A, a multi-layer wiring board 1b comprises a through hole 2, a conductive film 14, a ground line 16, and a lead line 17. The conductive film 14 is electrically connected to the ground line 16 and to the lead line 17. The ground line 16 and the lead line 17 are intra-layer conductive patterns, respectively. The lead line 17 is connected to the anode of an external power source (not illustrated).

Figure 4B:
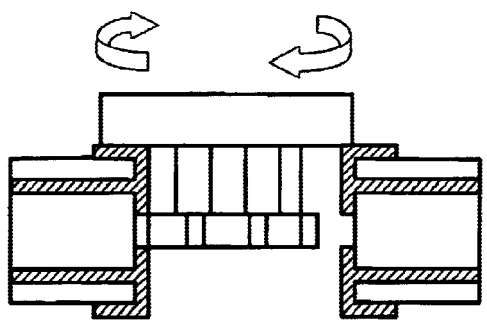

The electrode component 4 is inserted into the through hole 2. As shown in FIG. 4B, the electrode component 4 is rotated using the knob 7 to cut some parts of the conductive film 14. Thus, the conductive film 14 is divided into a portion that is electrically connected only to the ground line 16, and a portion that is electrically connected only to the lead line 17.

Figure 4C:
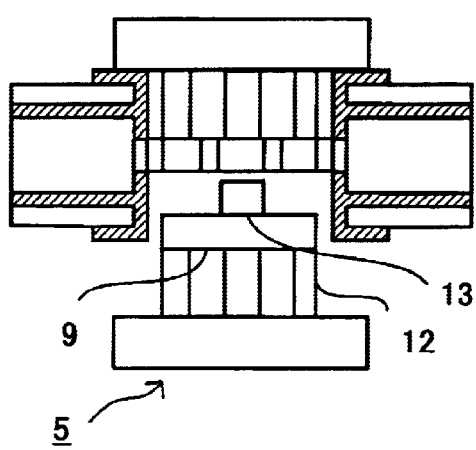
Figure 4D:
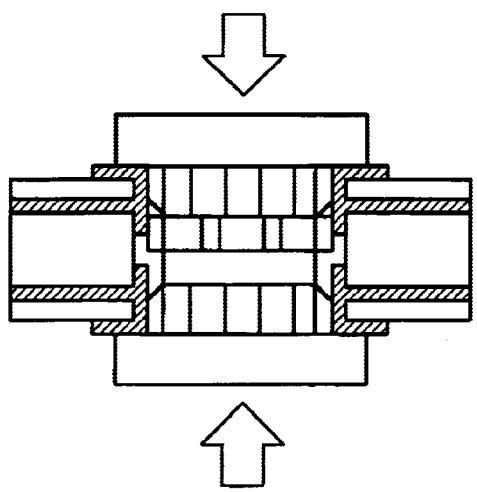

As shown in FIG. 4C, the electrode component 5 is inserted into the through hole 2 from the side counter to the side from which the electrode component 4 is inserted. When the electrode component 4 and the electrode component 5 are pressed against each other, the electrode 8 and the electrode 12 become spread within the through hole 2 and thus closely contact the conductive film 14.

The electrode 8 contacts parts of the conductive film 14 that are electrically connected to the ground line 16, and the electrode 12 contacts other parts of the conductive film 14 that are electrically connected to the lead line 17. Accordingly, the electrode 8 is electrically connected to the ground line 16, whereas the electrode 12 is electrically connected to the lead line 17.

Therefore, the conductive film portion which comes up to the front surface of the multi-layer wiring board 1b, and the conductive film potion which comes down to the back surface thereof can share an external circuit (not illustrated).

Third Embodiment

Figure 5:
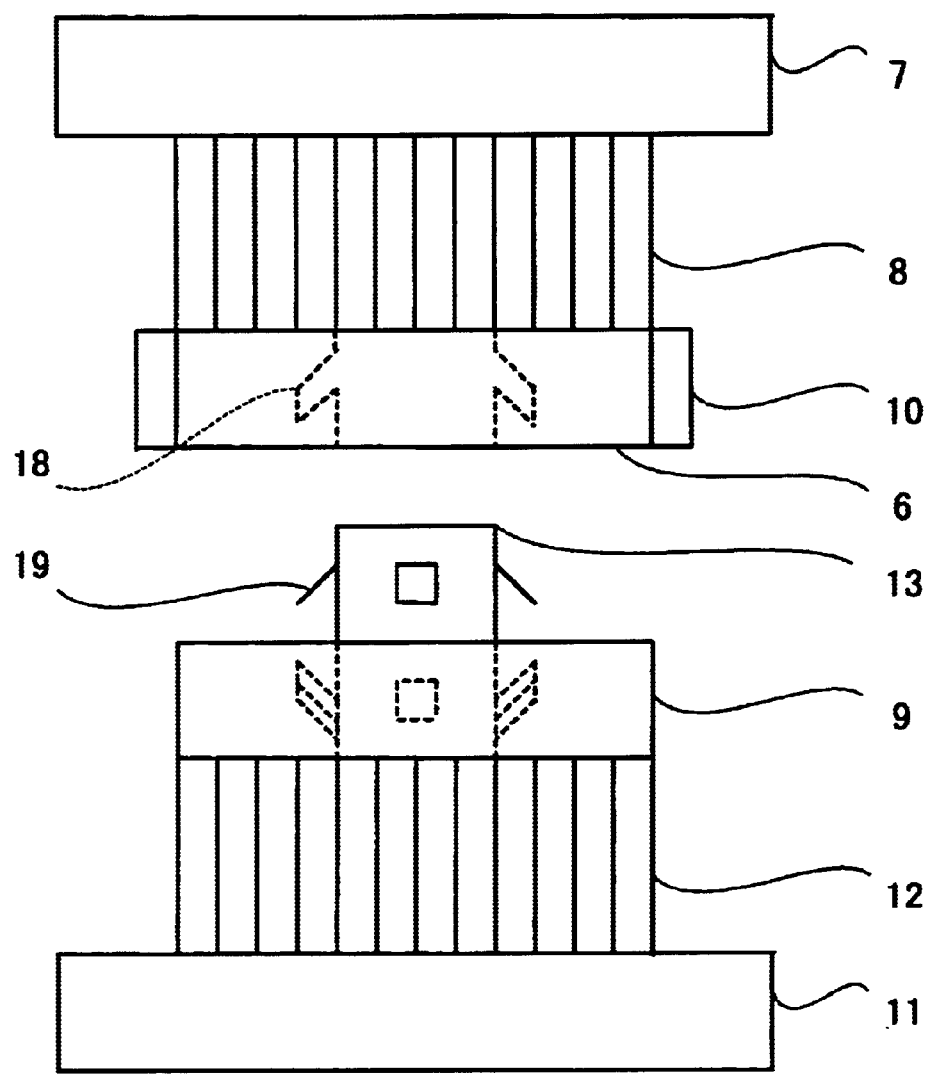
FIG. 5 is a side view showing the structure of a through hole insertion type electronic component according to a third embodiment of the present invention.

In a case where a through hole insertion type electronic component is used in an environment where external effect such as vibration is applied, the chip component 13 may be provided with a plurality of projections 19 on the both sides thereof, as shown in FIG. 5. Further, depressions 18 for accommodating the projections 19 may be provided to the supporting portion 6R and the supporting portion 9R for supporting the chip component 13.

With such a structure, the insulators 6 and 9 serve as female end couplers, and the chip component 13 serves as a male end coupler. Thus, once the electrode component 4 and the electrode component 5 are joined together by compression bonding, the electrode components 4 and 5 will not be detached from the through hole due to side effect such as vibration.

How to provide the depressions 18 and the projections 19 is arbitrary. Thus, the depressions 18 may be provided to the chip component 13, and the projections 19 may be provided to the insulators 6 and 9.

Fourth Embodiment

A through hole insertion type electronic component according to a fourth embodiment comprises conductive film separating blades which advance toward a direction perpendicular to the axis of the through hole when the electrode component 4 and the electrode component 5 contact each other with a pressure.

Figure 6A:
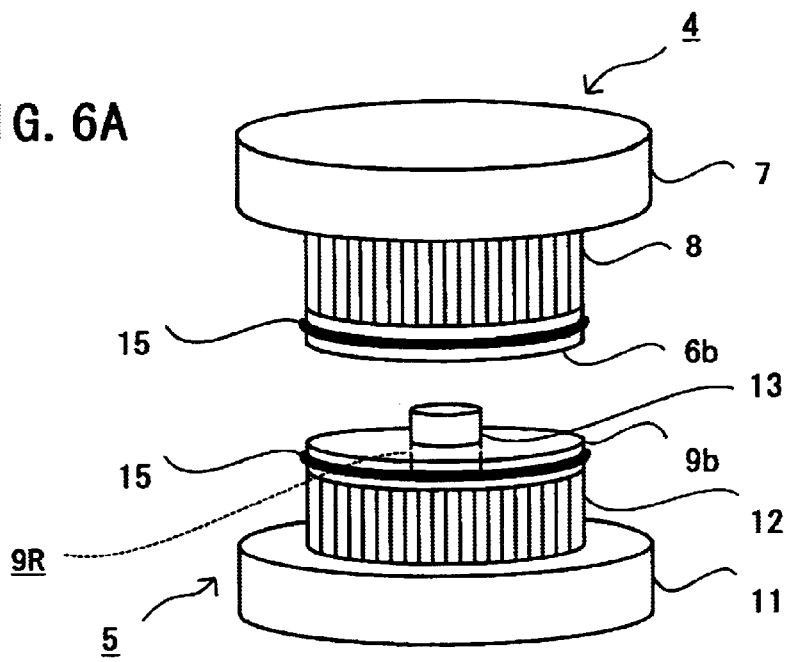
FIG. 6A to FIG. 6C are explanatory diagrams showing the structure of a through hole insertion type electronic component according to a fourth embodiment of the present invention.
Figure 6B:
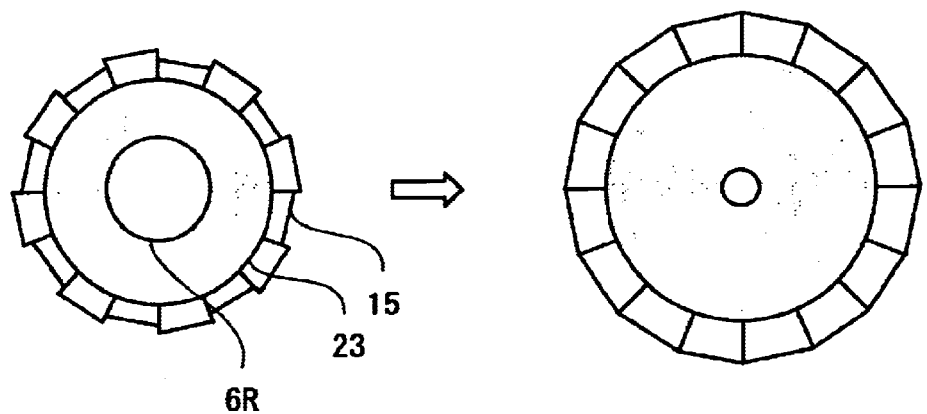
Figure 6C:
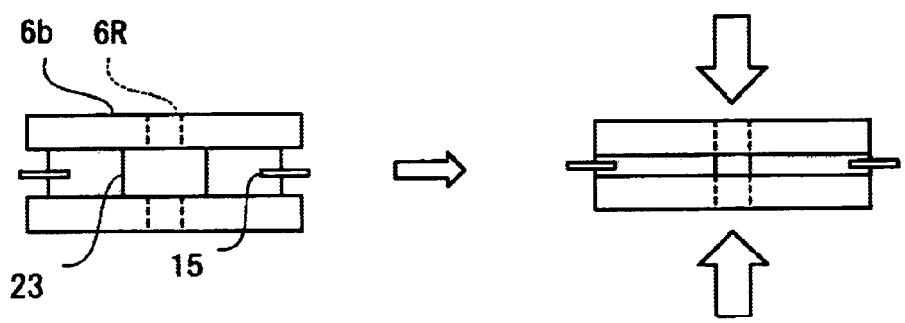

One example of a through hole insertion type electronic component comprising conductive film separating blades is illustrated in FIG. 6A to FIG. 6C.

The through hole insertion type electronic component comprises conductive film separating blades 15 at an insulator 6b and insulator 9b thereof, as shown in FIG. 6A The conductive film separating blades 15 are made of an insulation material such as ceramics, and provided along the circumference of the insulator 6b and insulator 9b.

More specifically, the conductive film separating blades 15 are respectively formed of a plurality of pieces which are dispersed and embedded in the insulator 6b of the electrode component 4, and the insulator 9b of the electrode component 5, as shown in a plan view in FIG. 6B, and in a cross section in FIG. 6C. As shown in FIG. 6C, the insulator 6b is divided into two portions, namely an upper portion and lower portion. An insulation member 23 and the conductive film separating blade 15 are sandwiched between the two portions. The insulation member 23 is made of an insulation material having plasticity, such as silicon, rubber, and the like. The insulator 9b has the same structure as that of the insulator 6b.

The insulator 6b and the insulator 9b have a structure which is spread with a pressure, as well as the electrodes 8 and 12. The insulators 6b and 9b are made of an insulation material such as silicon, rubber, and the like, and provided with supporting portions 6R and 9R for loading the chip component 13.

When the electrode component 4 and the electrode component 5 are pressed against each other, the insulator 6b and the insulator 9b become spread within the through hole. The insulation members 23 likewise become spread, and the conductive film separating blades 15 pop out from the insulators 6b and 9b thereby to cut into the internal wall of the through hole, as shown in FIG. 6C.

Next, a method and steps of packaging the through hole insertion type electronic component according to this embodiment will be explained with reference to FIG. 7A to FIG. 7D.

As shown in FIG. 7A and FIG. 7B, the electrode component 4 is inserted into the through hole 2 from one side of the multi-layer wiring board 1. Then, as shown in FIG. 7C, the electrode component 5 is inserted into the through hole 2 from the other side of the multi-layer wiring board 1.

A pressure is applied to the electrode component 4 and the electrode component 5 in a direction parallel to the axis of the through hole. At this time, the electrodes 8 and 12 and the insulators 6b and 9b are crushed with the pressure and spread within the through hole 2 to contact the conductive film 14.

When the insulators 6b and 9b are spread, the conductive film separating blades 5 are spread in response to this and firmly cut into the conductive film 14 on the through hole 2, and further into the multi-layer wiring board 1.

By employing this structure, the through hole insertion type electronic component according to this embodiment achieves the following advantages.

(1) With a pressure applied thereto, the conductive film separating blades 15 are spread and cut into the conductive film 14 firmly, and thereby disconnect the electrical connection between the upper and lower portions of the conductive film 14. That is, the step of rotating the electrode component 4 is not required in order to cut the electrical connection between the front surface conductive pattern 14a and the back surface conductive pattern 14b. This will lead to the simplification of the packaging steps.

(2) Since the conductive film separating blades 15 firmly cut into the conductive film 14 and the multi-layer wiring board 1, the electrode component 4 and the electrode component 5 can be prevented from being detached from the multi-layer wiring board 1.

Fifth Embodiment

Figure 8A:
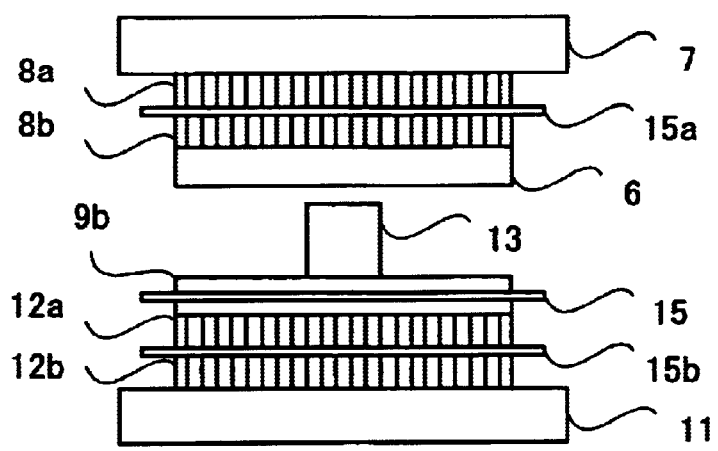
FIG. 8A to FIG. 8C are explanatory diagrams showing the structure of a through hole insertion type electronic component according to a fifth embodiment of the present invention.

According to the above described fourth embodiment, the conductive film separating blades 15 are provided to the insulators 6b and 9b. However, blades for separating the conductive film may be provided to other parts of the electrode components 4 and 5. In this case, the through hole insertion type electronic component further comprises conductive film separating blades 15a and 15b in addition to the conductive film separating blade 15, as shown in the side view of FIG. 8A.

The electrode 8 is divided into an upper electrode 8a and lower electrode 8b via the conductive film separating blade 15a. Likewise, the electrode 12 is divided into an upper electrode 12a and lower electrode 12b via the conductive film separating blade 15b.

Figure 8B:
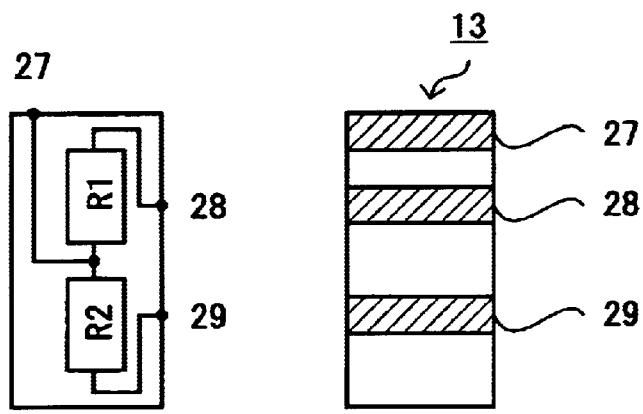

As shown in FIG. 8B, resistors R1 and R2 are loaded in the chip component 13, and terminals (electrodes) 27, 28, and 29 are formed on the surface of the chip component 13. More specifically, one terminal of the resistor R1 is connected to the terminal 27, and the other terminal thereof is connected to the terminal 28. One terminal of the resistor R2 is connected to the terminal 27, and the other terminal thereof is connected to the terminal 29.

When the electrode component 4 and the electrode component 5 contact each other, the terminal 29 comes in contact with the upper electrode 12a of the electrode 12 to be connected thereto. The terminal 27 and the terminal 28 touch the upper electrode 8a and lower electrode 8b of the electrode 8 respectively, to be connected thereto.

Figure 8C:
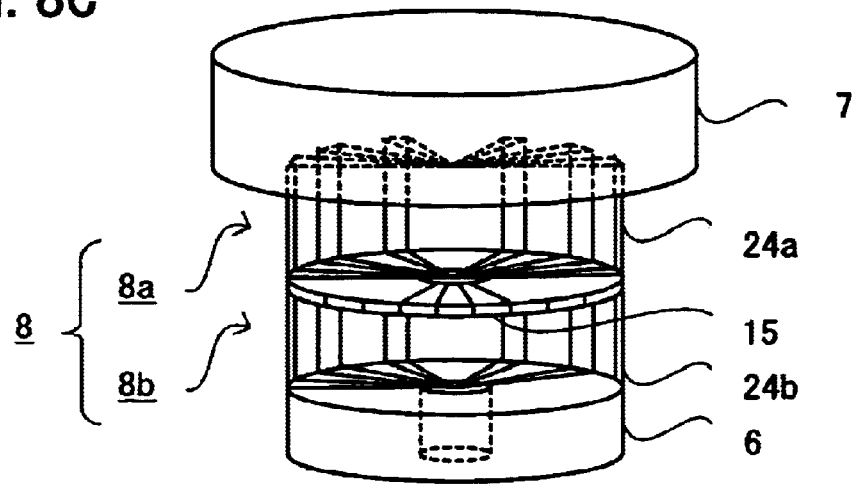

The structure of the electrode 8 is exemplified in FIG. 8C.

The upper electrode 8a is formed of metal pieces 24a, which are arranged like a circle. The lower electrode 8b is formed or metal pieces 24b arranged like a circle. The upper electrode 8a is stacked on the lower electrode 8b via the conductive film separating blade 15a.

The electrode 12 has the same structure as that of the electrode 8.

Figure 9A:
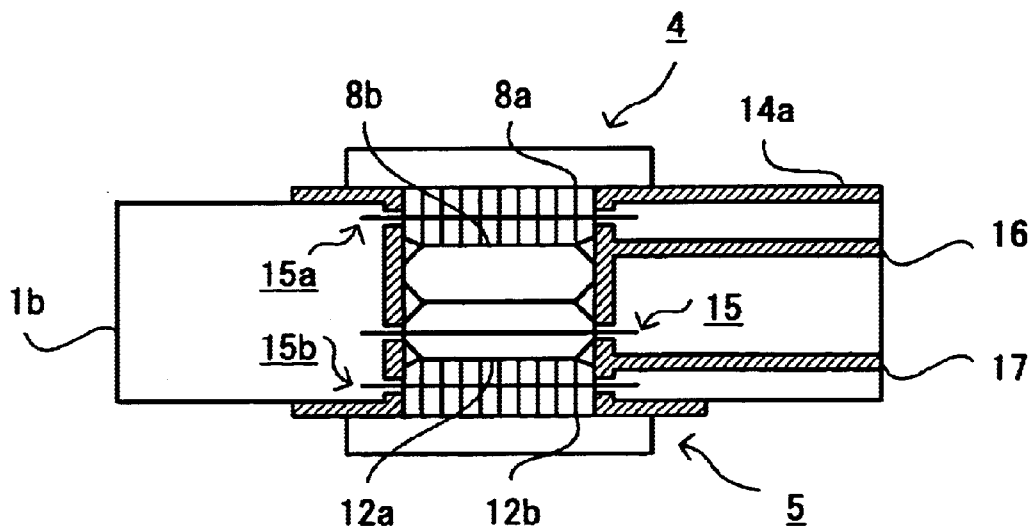
FIG. 9A and FIG. 9B are explanatory diagrams showing a method of packaging the through hole insertion type electronic component shown in FIG. 8.

The through hole insertion type electronic component having this structure will be packaged onto a multi-layer wiring board. As shown in FIG. 9A, the multi-layer wiring board 1b comprises a front surface conductive pattern 14a, a ground line 16, and a lead line 17.

The electrode component 4 and the electrode component 5 are inserted into the through hole 2, so as to contact each other. At this time, the conductive film 14 is separated into four portions by the conductive film separating blades 15, 15a, and 15b. That is, the conductive film 14 is separated into a portion electrically connected to the front surface conductive pattern 14a, a portion electrically connected to the ground line 16, a portion electrically connected to a lead line 17, and the remaining portion. Electrical connection through the entire conductive film 14, namely among the front surface conductive pattern 14a, the ground line 16, and the lead line 17 is separated from each other.

The upper electrode 8a of the electrode 8 becomes spread and contacts the portion of the conductive film 14 that is electrically connected to the front surface conductive pattern 14a. Thus, the upper electrode 8a is connected to the front surface conductive pattern 14a. The lower electrode 8b becomes spread and contacts the portion of the conductive film 14 that is electrically connected to the ground line 16, and thus the lower electrode 8b is connected to the ground line 16. Further, the upper electrode 12a of the electrode 12 becomes spread and contacts the portion of the conductive film 14 that is electrically connected to the lead line 17, thus the upper electrode 12a is connected to the lead line 17.

Figure 9B:
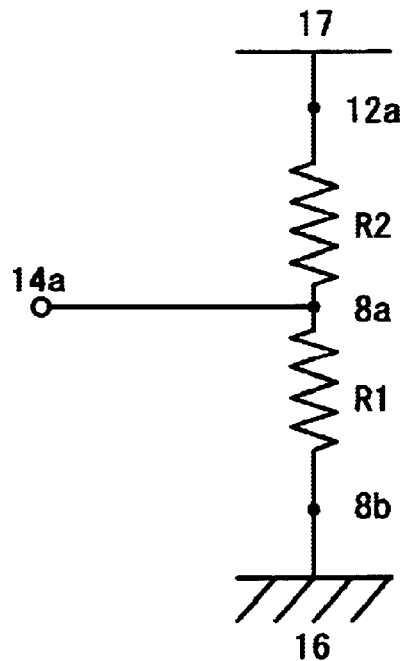

As a result, a circuit shown in FIG. 9B is formed in the through bole 2. One terminal of the resistor R1 and one terminal of the resistor R2 are connected to the front surface conductive pattern 14a through the upper electrode 8a of the electrode component 4. The other terminal of the resistor R1 is connected to the ground line 16 via the lower electrode 8b, and the other terminal of the resistor R2 is connected to the lead line 17 via the upper electrode 12a of the electrode component 5.

With the use of the above described through hole insertion type electronic component comprising the three conductive film separating blades 15, 15a, and 15b, the chip component 13 having three terminals can be packaged in the through hole.

Sixth Embodiment

In the above fifth embodiment, a chip component having three terminals is used. However, a chip component having four terminals may be used. A through hole insertion type electronic component according to this embodiment will be explained with reference to FIG. 10A to FIG. 10D.

The electrode component 4 comprises an insulator 6, a knob 7, an electrode 8, and a conductive film separating blade 15a. The electrode component 5 comprises an insulator 9, a knob 11, an electrode 12, a chip component 13, and conductive film separating blades 15 and 15b.

The electrode 8 is divided into two parts, namely, an upper electrode 8a and a lower electrode 8b. The electrode 12 is divided into two parts, namely, an upper electrode 12a and a lower electrode 12b.

Figure 10A:
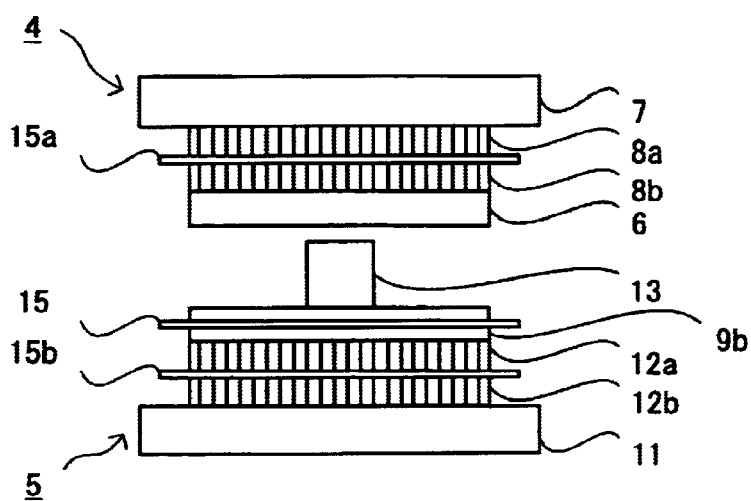
FIG. 10A to FIG. 10D are diagrams showing the structure of a through hole insertion type electronic component according to a sixth embodiment of the present invention.
Figure 10B:
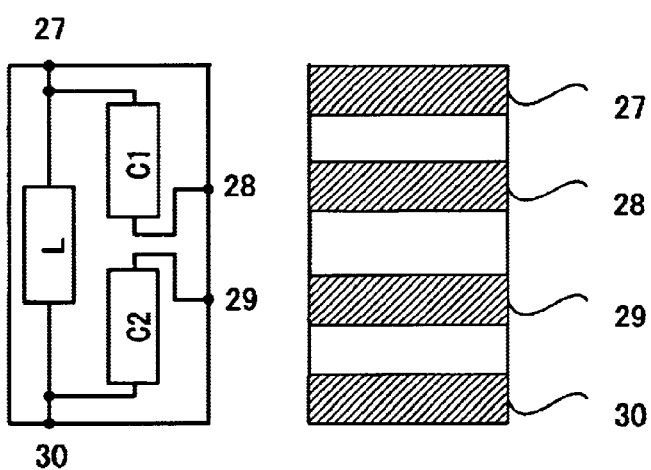

As shown in FIG. 10B, capacitors C1 and C2 and a coil L are loaded in the chip component 13. Terminals 27 to 30 are formed on the surface of the chip component 13. More specifically, one electrode of the capacitor C1 is connected to the terminal 27, and the other electrode of the capacitor C1 is connected to the terminal 28. One electrode of the capacitor C2 is connected to the terminal 29, and the other electrode of the capacitor C2 is connected to the terminal 30. One terminal or the coil L is connected to the terminal 27, and the other terminal of the coil L is connected to the terminal 30.

When the electrode component 4 and the electrode component 5 contact each other, the terminal 27, the terminal 28, the terminal 29, and the terminal 30 are connected to the upper electrode 8a, the lower electrode 8b, the upper electrode 12a, and the lower electrode 12b, respectively.

Figure 10C:
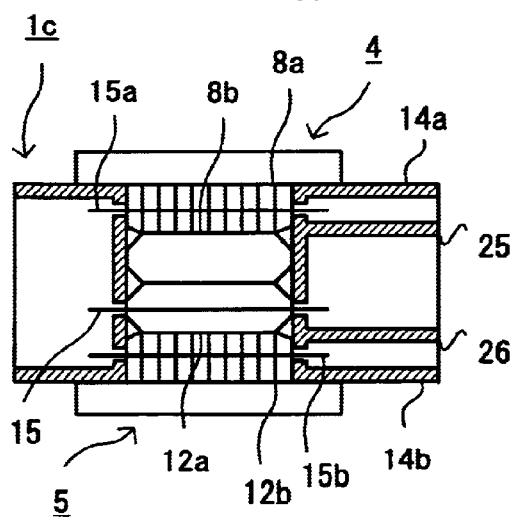
Figure 10D:
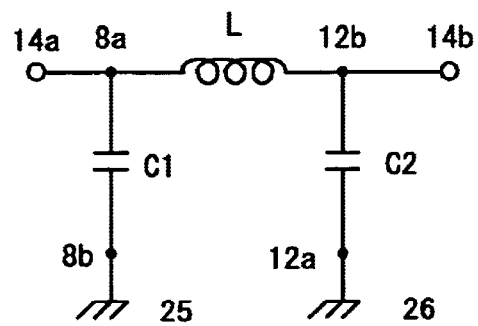
Figure 12A:
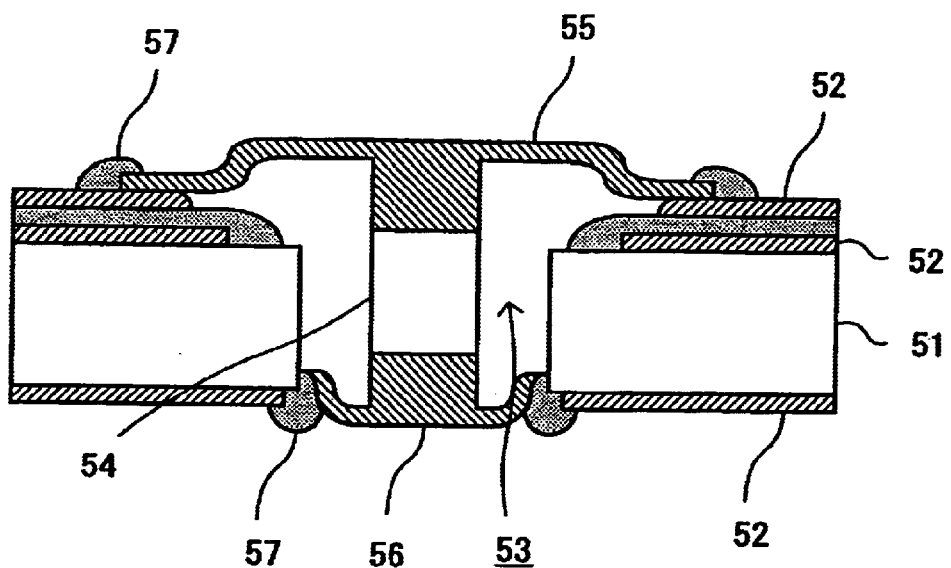
FIG. 12A to FIG. 12C are diagrams for explaining an example of a prior art.
Figure 12B:
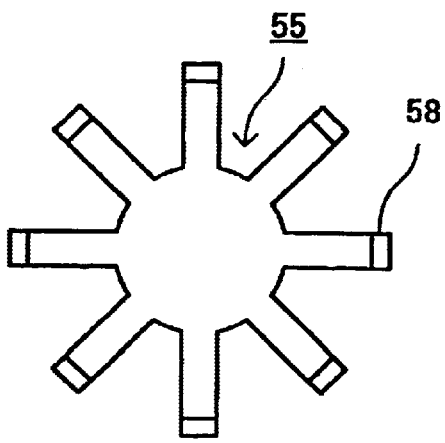
Figure 12C:
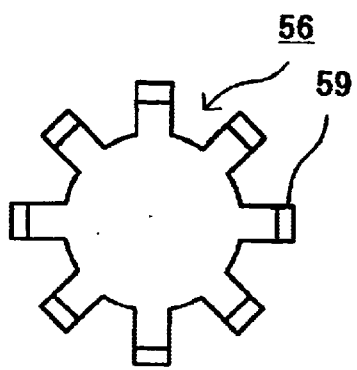

The through hole insertion type electronic component having such a structure will be packaged onto a multi-layer wiring board. As shown in FIG. 10C, the multi-layer wiring board 1c comprises a through hole 2, an conductive film 14, a front surface conductive pattern 14a, an intra-layer conductive patterns 25 and 26, and a back surface conductive pattern 14b.

The electrode component 4 and the electrode component 5 are inserted into the through hole 2, so that the both components contact are joined together. At this time, the conductive film 14 is separated into four portions by the conductive film separating blades 15, 15a, and 15b.

The terminal 27 is connected to the front surface conductive pattern 14a via the upper electrode 8a of the electrode component 4, and the terminal 28 is connected to the intra-layer conductive pattern 25 via the lower electrode 8b. The terminal 29 is connected to the intra-layer conductive pattern 26 via the upper electrode 12a of the electrode component 5, and the terminal 30 is connected to the back surface conductive pattern 14b via the lower electrode 12b.

For example, if the intra-layer conductive patterns 25 and 26 are used as ground lines, a π-network as shown in FIG., 10D is formed in the through hole 2.

As described above, if the through hole insertion type electronic component according to this embodiment is used, a chip component having four terminals can be packaged into the through hole 2.

Seventh Embodiment

A through hole insertion type electronic component according to a seventh embodiment comprises not only a separating blade for separating the conductive film on the internal wall of the through hole, but also conductive pattern separating blades for separating conductive patterns on the surfaces of the multi-layer wiring board. One example of the present embodiment is shown in FIG. 11A to FIG. 11C.

This through hole insertion type electronic component comprises conductive pattern separating blades 21 and 22, in addition to the conductive film separating blade 15, as shown in FIG. 11A.

According to this embodiment, the knob 7 shown in FIG. 1A is used as an upper electrode 8a of the electrode component 4, as shown in FIG. 11A. Also, the knob 11 shown in FIG. 1A is used as a lower electrode 12b of the electrode component 5.

Resistors R1 and R2 are loaded in the chip component 13.

The through hole insertion type electronic component shown in FIG. 11A will be packaged onto a multi-layer wiring board. As shown in FIG. 11B, a through hole 2, a front surface conductive pattern 14a, a back surface conductive pattern 14b, a ground line 16, and a lead line 17 are formed on the multi-layer wiring board 1b.

The electrode component 4 and the electrode component 5 are inserted into the through hole 2 of the multi-layer wiring board 1b, so as to contact each other.

Electrical connection between the front surface conductive pattern 14a and the conductive film 14 is cut off by the conductive pattern separating blade 21, and also electrical connection between the back surface conductive pattern 14b and the conductive film 14 is cut off by the conductive pattern separating blade 22.

At the same time, the conductive film 14 within the through hole 2 is separated into two by the conductive film separating blade 15.

Specifically, the conductive film 14 is separated into a portion that is electrically connected to the ground line 16, and a portion that is electrically connected to the lead line 17. Furthermore, electrical connection between the front surface conductive pattern 14a and the ground line 16 is cut off, and electrical connection between the back surface conductive pattern 14b and the lead line 17 is cut off.

The upper electrode 8a of the electrode component 4 is connected to the front surface conductive pattern 14a, and the lower electrode 8b thereof is connected to the ground line 16. On the other hand, the upper electrode 12a of the electrode component 5 is connected to the lead line 17, and the lower electrode 12b thereof is connected to the back surface conductive pattern 14b.

Consequently, a circuit shown in FIG. 11C is formed in the through hole 2. One terminal of the resistor R1 and one terminal of the resistor R2 are connected to each other via the upper electrode 8a of the electrode component 4, and the upper electrode 8a is connected to the front surface conductive pattern 14a. The other terminal of the resistor R1 is connected to the ground line 16 via the lower electrode 8b, and the other terminal of the resistor R2 is connected to the lead line 17 via the upper electrode 12a of the electrode component 5.

By employing such a structure, the through hole insertion type electronic component according to this embodiment comprises the electrodes 8b and 12a in the through hole 2, and comprises the electrodes 8a and 12b on both surfaces of the multi-layer wiring board 1b.

For example, if the through hole insertion type electronic component according to this embodiment is used in an environment where wirings are designed so complicatedly that terminals for bringing in power supply are not enough, it is possible to bring in power from the electrodes 8a and 12b on both sides of the multi-layer wiring board 1b. Thus, shortage of terminals can be overcome.

The present invention is not limited to the above described embodiments. For example, the electrode component 5 may not necessarily be inserted to the through hole 2 after the electrode component 4 is inserted thereto. The electrode component 5 may be inserted to the through hole 2 first, and after this, the electrode component 4 may be inserted to the through hole 2, so that the electrode components 4 and 5 contact each other.

The electrode components 4 and 5 may not be formed of the metal pieces 24, 24a, or 24b, but may be formed of mixed resin which has plasticity and into which conductive powder particles are mixed.

Various embodiments and changes may be made thereunto without departing from the broad spirit and scope of the invention. The above-described embodiments are intended to illustrate the present invention, not to limit the scope of the present invention. The scope of the present invention is shown by the attached claims rather than the embodiments. Various modifications made within the meaning of an equivalent of the claims of the invention and within the claims are to be regarded to be in the scope of the present invention.

This application is based on Japanese Patent Application No. 2001-190603 filed on Jun. 25, 2001 and including specification, claims, drawings and summary. The disclosure of the above Japanese Patent Application is incorporated herein by reference in its entirety.

What is claimed is:

1. A through hole insertion type electronic component inserted into a through hole of a multi-layer wiring board which comprises: the through hole; a through hole conductive film formed on an internal surface of the through hole; and n, n is an integer equal to or greater than 2, number of wiring patterns which are provided on different layers and connected to the through hole conductive film, said electronic component comprising:

n number of electrodes each of which is connected to a corresponding one of n number of electrodes of a chip component which is arranged in the through hole, and each of which contacts a corresponding position of the through bole conductive film; and at least one blade which separates the through hole conductive film into n number of portions each of which is connected to a corresponding one of the n number of wiring patterns and to a corresponding one of said n number of electrodes.

2. The through bole insertion type electronic component according to claim 1, wherein n represents 2, said electronic component comprises: a first electrode component to be packaged on one surface of the multi-layer wiring board; and a second electrode component to be packaged on the other surface of the multi-layer wiring board, said n number of electrodes include: a first electrode which is provided to said first electrode component, and is electrically connected to a first electrode of the chip component arranged in the through hole and also contacts the through hole conductive film so as to electrically connect the first electrode of the chip component and the through hole conductive film to each other; and a second electrode which is provided to said second electrode component, and is electrically connected to a second electrode of the chip component arranged in the through hole and also contacts the through hole conductive film so as to electrically connect the second electrode of the chip component and the through hole conductive film to each other, and said blade is provided to at least one of said first and second electrode components, and separates the through hole conductive film into: a portion which is electrically connected to said fist electrode and a first wiring pattern; and a portion which is electrically connected to said second electrode and a second wiring pattern.

3. The through hole insertion type electronic component according to claim 1, wherein n represents 3, said electronic component comprises: a first electrode component to be packaged on one surface of the multi-layer wiring board; and a second electrode component to be packaged on the other surface of the multi-layer wing board, said n number of electrodes include: a first electrode which is provided to said first electrode component, and is electrically connected to a first electrode of the chip component arranged in the through hole and also contacts the through hole conductive film so as to electrically connect the first electrode of the chip component and the through hole conductive film to each other, a second electrode which is provided to said second electrode component, and is electrically connected to a second electrode of the chip component arranged in the through hole and also contacts the through hole conductive film so as to electrically connect the second electrode of the chip component and the through hole conductive film to each other, and a third electrode which is provided to one of said first electrode component and said second electrode component, and is electrically connected to a third electrode of the chip component arranged in the through hole and also contacts the through hole conductive film so as to electrically connect the third electrode of the chip component and the through hole conductive film to each other, and said blade is provided to at least one of said first and second electrode components, and separates the through hole conductive film into: a portion which is electrically connected to said first electrode and a first wiring pattern; a portion which is electrically connected to said second electrode and a second wiring pattern: and a portion which is electrically connected to said third electrode and a third wiring pattern.

4. The through hole insertion type electronic component according to claim 1, wherein n represents 4, said electronic component comprises: a first electrode component to be packaged on one surface of the multi-layer wiring board; and a second electrode component to be packaged on the other surface of the multi-layer wiring board, said n number of electrodes include: a first electrode which is provided to said first electrode component, and is electrically connected to a first electrode of the chip component arranged in the through bole and also contacts the through hole conductive film so as to electrically connect the first electrode of the chip component and the through hole conductive film to each other; a second electrode which is electrically connected to a second electrode of the chip component arranged in the through hole and also contacts the through hole conductive film so as to electrically connect the second electrode of the chip component and the through hole conductive film to each other; a third electrode which is provided to said second electrode component, and is electrically connected to a third electrode of the chip component arranged in the through hole and also contacts the through hole conductive film so as to electrically connect the third electrode of the chip component and the through hole conductive film to each other; and a fourth electrode which is electrically connected to a fourth electrode of the chip component arranged in the through hole and also contacts the through hole conductive film so as to electrically connect the fourth electrode of the chip component and the through hole conductive film to each other, and said blade is provided to at least one of said first and second electrode components, and separates the through hole conductive film into: a portion which is electrically connected to said first electrode and a first wiring pattern, a portion which is electrically connected to said second electrode and a second wiring pattern; a portion which is electrically connected to said third electrode and a third wiring pattern; and a portion which is electrically connected to said fourth electrode and a fourth wiring pattern.

5. The through hole insertion type electronic component according to claim 1, further comprising
   a supporting portion which can be inserted into the through hole, and supports the chip component arranged in the through hole, when it is inserted in the through hole.

6. The through hole insertion type electronic component according to claim 5, wherein
   n represents 2,
   said electronic component comprises: a first electrode component to be packaged on one surface of the multi-layer wiring board; and a second electrode component to be packaged on the other surface of the multi-layer wiring board,
   said supporting portion includes: a first supporting portion which is formed in said first electrode component and supports one end of the chip component; and a second supporting portion which is formed in said second electrode component and supports the other end of the chip component,
   said n number of electrodes include: a first electrode which is provided to said first electrode component, and is electrically connected to a first electrode of the chip component arranged in the through hole and also contacts the through hole conductive film so as to electrically connect the first electrode of the chip component and the through hole conductive film to each other; and a second electrode which is provided to said second electrode component, and is electrically connected to a second electrode of the chip component arranged in the through hole and also contacts the through hole conductive film so as to electrically connect the second electrode of the chip component and the through hole conductive film to each other, and
   said blade is provided to at least one of said first and second electrode components, and separates the through hole conductive film into: a portion which is electrically connected to said first electrode and a first wiring pattern; and a portion which is electrically connected to said second electrode and a second wiring pattern.

7. The through hole insertion type electronic component according to claim 5, wherein
   n represents 3,
   said electronic component comprises: a first electrode component to be packaged on one surface of the multi-layer wiring board; and a second electrode component to be packaged on the other surface of the multi-layer wiring board,
   said supporting portion includes: a first supporting portion which is formed in said first electrode component and supports one end of the chip component; and a second supporting portion which is formed in said second electrode component and supports the other end of the chip component,
   said n number of electrodes include: a first electrode which is provided to said first electrode component, and is electrically connected to a first electrode of the chip component arranged in the through hole and also contacts the through hole conductive film so as to electrically connect the first electrode of the chip component and the through hole conductive film to each other, a second electrode which is provided to said second electrode component, and is electrically connected to a second electrode of the chip component arranged in the through hole and also contacts the through hole conductive film so as to electrically connect the second electrode of the chip component and the through hole conductive film to each other; and a third electrode which is provided to one of said first electrode component and said second electrode component, and is electrically connected to a third electrode of the chip component arranged in the through hole and also contacts the through hole conductive film so as to electrically connect the third electrode of the chip component and the through hole conductive film to each other, and
   said blade is provided to at least one of said first and second electrode components, and separates the through hole conductive film into: a portion which is electrically connected to said first electrode and a first wiring pattern; a portion which is electrically connected to said second electrode and a second wiring pattern; and a portion which is electrically connected to said third electrode and a third wiring pattern.

8. The through hole insertion type electronic component according to claim 5, wherein
   n represents 4,
   said electronic component comprises: a first electrode component to be packaged on one surface of the multi-layer wiring board; and a second electrode component to be packaged on the other surface of the multi-layer wiring board,
   said supporting portion includes: a first supporting portion which is formed in said first electrode component and supports one end of the chip component; and a second supporting portion which is formed in said second electrode component and supports the other end of the chip component,
   said n number of electrodes include: a first electrode which is provided to said first electrode component, and is electrically connected to a first electrode of the chip component arranged in the through hole and also contacts the through hole conductive film so as to electrically connect the first electrode of the chip component and the through hole conductive film to each other, a second electrode which is electrically connected to a second electrode of the chip component arranged in the through hole and also contacts the through hole conductive film so as to electrically connect the second electrode of the chip component and the through hole conductive film to each other; a third electrode which is provided to said second electrode component, and is electrically connected to a third electrode of the chip component arranged in the through hole and also contacts the through hole conductive film so as to electrically connect the third electrode of the chip component and the through hole conductive film to each other; and a fourth electrode which is electrically connected to a fourth electrode of the chip component arranged in the through hole and also contacts the through hole conductive film so as to electrically connect the fourth electrode of the chip component and the through hole conductive film to each other, and said blade is provided to at least one of said first and second electrode components, and separates the through hole conductive film into: a portion which is electrically connected to said first electrode and a first wiring pattern; a portion which is electrically connected to said second electrode and a second wiring pattern; a portion which is electrically connected to said third electrode and a third wiring pattern; and a portion which is electrically connected to said fourth electrode and a fourth wiring pattern.

9. The through hole insertion type electronic component according to claim 1, wherein said electronic component comprises: a first electrode component to be packaged on one surface of the multi-layer wiring board; and a second electrode component to be packaged on the other surface of the multi-layer wiring board, said first electrode component and said second electrode component are pressed against each other, when they are inserted into the through hole, and each of said n number of electrodes is provided to one of said first electrode component and said second electrode component, and at least one of said n number of electrodes becomes spread to contact the through hole conductive film, when a pressure is applied thereto.

10. The through hole insertion type electronic component according to claim 1, wherein said blade is rotated with a rotation centering on a portion of said through hole insertion type electronic component that is inserted in the through hole, and thereby to cut the through hole conductive film on the internal surface of the through hole.

11. The through hole insertion type electronic component according to claim 1, wherein said blade is made of an insulation material.

12. The though hole insertion type electronic component according to claim 1, wherein said n number of electrodes each provided to either one of said first electrode component and said second electrode component are respectively formed of a plurality of metal pieces having plasticity arranged like a circle.

13. The through hole insertion type electronic component according to claim 1, wherein said n number of electrodes each provided to either one of said first electrode component and said second electrode component are made of a mixed resin which has plasticity and into which conductive particles are mixed.

14. The through hole insertion type electronic component according to claim 1, further comprising fixers for fixing the chip component to said through hole insertion type electronic component.

* * * * *

UNITED STATES PATENT AND TRADEMARK OFFICE
CERTIFICATE OF CORRECTION

PATENT NO. : 6,734,373 B2
DATED : May 11, 2004
INVENTOR(S) : Hideki Seki

It is certified that error appears in the above-identified patent and that said Letters Patent is hereby corrected as shown below:

<u>Title page,</u>
Insert Item:
-- [30]    Foreign Application Priority Data
Jun. 25, 2001   (JP)………………….. 2001-190603 --.

Signed and Sealed this

Fourteenth Day of June, 2005

JON W. DUDAS
*Director of the United States Patent and Trademark Office*